United States Patent
Khemka et al.

(10) Patent No.: US 7,405,128 B1
(45) Date of Patent: Jul. 29, 2008

(54) DOTTED CHANNEL MOSFET AND METHOD

(75) Inventors: Vishnu K. Khemka, Phoenix, AZ (US); Amitava Bose, Tempe, AZ (US); Todd C. Roggenbauer, Chandler, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/674,888

(22) Filed: Feb. 14, 2007

(51) Int. Cl.
*H01L 21/336* (2006.01)
(52) U.S. Cl. ............... 438/286; 438/290; 257/E21.618
(58) Field of Classification Search .............. 438/282, 438/286, 290; 257/E21.618
See application file for complete search history.

(56) References Cited

U.S. PATENT DOCUMENTS

| | | | |
|---|---|---|---|
| 6,198,141 B1 * | 3/2001 | Yamazaki et al. ........... 257/404 |
| 6,211,552 B1 | 4/2001 | Efland et al. | |
| 6,566,710 B1 | 5/2003 | Strachan et al. | |
| 2005/0110081 A1 | 5/2005 | Pendharkar | |
| 2005/0255655 A1 | 11/2005 | Hower et al. | |
| 2006/0051933 A1 | 3/2006 | Pendharkar | |

* cited by examiner

*Primary Examiner*—Chandra Chaudhari
(74) *Attorney, Agent, or Firm*—Ingrassia, Fisher & Lorenz, P.C.

(57) ABSTRACT

A improved MOSFET (50, 51, 75, 215) has a source (60) and drain (62) in a semiconductor body (56), surmounted by an insulated control gate (66) located over the body (56) between the source (60) and drain (62) and adapted to control a conductive channel (55) extending between the source (60) and drain (62). The insulated gate (66) is perforated by a series of openings (61) through which highly doped regions (69) in the form of a series of (e.g., square) dots (69) of the same conductivity type as the body (56) are provided, located in the channel (55), spaced apart from each other and from the source (60) and drain (62). These channel dots (69) are desirably electrically coupled to a highly doped contact (64) to the body (56). The resulting device (50, 51, 75, 215) has a greater SOA, higher breakdown voltage and higher HBM stress resistance than equivalent prior art devices (20) without the dotted channel. Threshold voltage is not affected.

7 Claims, 9 Drawing Sheets

200  201

202  203

DOTTED CHANNEL MOSFET AND METHOD

FIELD OF THE INVENTION

The present invention generally relates to semiconductor devices and methods for fabricating semiconductor devices, and more particularly relates to devices embodying a field controlled conductive channel.

BACKGROUND OF THE INVENTION

Metal oxide semiconductor field effect transistors (MOSFETs) are well known in the art. They operate by virtue of a field controlled channel established in a semiconductor body or surface. They come in a wide variety of forms and employ other materials besides simple metals and oxides. Persons of skill in the art understand that the word "metal" in the term MOSFET refers to any form of a electrically conductive material, as for examples and not intended to be limiting, simple metals, metal alloys, semi-metals, mixtures, semiconductors, conductive organics, conductive silicides, conductive nitrides and other conductive materials. Accordingly, the terms "metal" and "silicide" as used herein are intended to include such variations as well as other suitable conductors. A wide variety of semiconductors can be used in forming MOSFETs, such as for example and not intended to be limiting, types IV, III-V and II-VI semiconductors, organic semiconductors, and layered structures such as for example and not intended to be limiting, semiconductor-on-insulator (SOI) structures. Accordingly, the term "semiconductor" is intended to include these and other materials and arrangements suitable for forming field controlled devices. Persons of skill in the art further understand that the word "oxide" in the label MOSFET stands for any of a large number of insulating dielectrics and is not limited merely to oxides. Thus, the terms metal, oxide, semiconductor and MOSFET are intended to include these and other variations.

Further, MOSFETs can be formed with N or P type channels, depending upon the conductivity type of the various semiconductor regions and the polarity of the control voltage, and as enhancement mode or depletion mode devices depending upon the threshold voltage of the device. For convenience of explanation and not intended to be limiting, the invention is described herein for the case of N-channel devices. However, persons of skill in the art will understand that P-channel devices may be obtained by interchanging the various P and N regions of the device, that is, N-type regions are replaced by P-type regions and vice-versa. Thus, the description of N-channel devices herein serves to illustrate either N or P channel devices and the identification of particular regions of the device as being N or P conductivity type may be replaced by the more general terms "first conductivity type" or "second, opposite, conductivity type" where the "first conductivity type" may be either N or P type and the "second, opposite, conductivity type" will then be P or N type respectively, the choice depending upon what type of device (N or P Channel) is desired.

Conventional MOSFETs can inherently include parasitic bipolar devices. While such parasitic bipolar devices may not interfere significantly with operation of the MOSFET under many operating conditions, their existence can significantly degrade device properties when the device is operated at extremes of voltage and/or current. This can provide a device safe operating area (SOA) that is smaller than desired and/or the device can be more susceptible to transient stress failure than is desired. Thus, such parasitic bipolar interaction can lead to MOSFETs that are less robust than desired.

Accordingly, it is desirable to provide a new type of MOSFET with improved operating characteristics, and more particularly, MOSFETs with enhanced safe operating area (SOA), and whose parasitic bipolar operation is substantially defeated with little adverse affect on the series ON-resistance of the device. In addition, it is desirable to provide a structure and method for fabricating MOSFETs suitable for use and co-fabrication with complex devices and/or integrated circuits and especially with state of the art Smart Power technologies. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
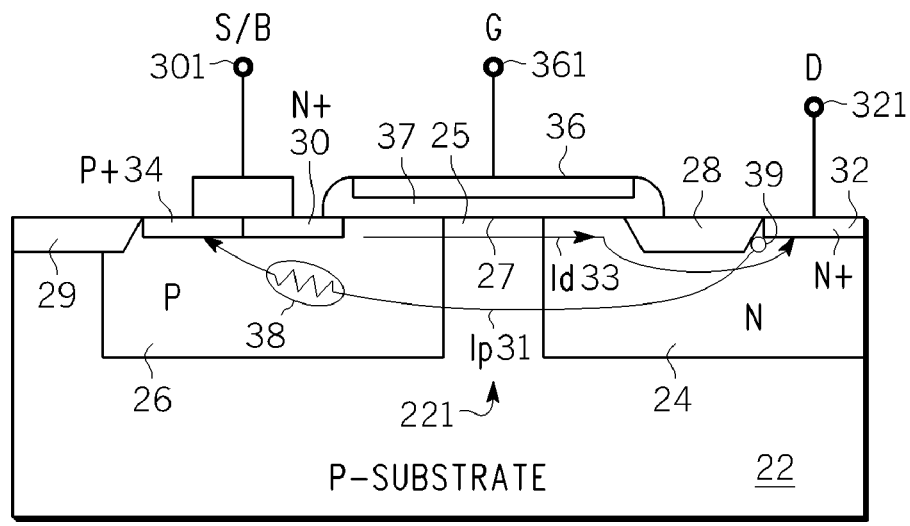
FIG. 1 is a simplified schematic cross-sectional view through a conventional N-channel MOSFET according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

FIG. 1 is a simplified schematic cross-sectional view through conventional N-channel MOSFET device 20 according to the prior art. Device 20 comprises P-substrate 22 (e.g., silicon) having surface 27. N-well 24 and P-well 26 are formed in substrate 22. Dielectric isolation regions 28, 29 (e.g., silicon oxide) are formed in surface 27 of substrate 22. N+ source region 30 is formed in P-well 26 and N+ drain region 32 is formed in N-well 24. Source region 30 and drain region 32 are spaced apart in surface 27. Drain region 32 is proximate dielectric isolation region 28 on the opposite side thereof from source region 30. Gate dielectric (e.g., silicon oxide) 37 is formed on surface 27 and gate 36 (e.g., doped polysilicon) is provided overlying gate dielectric 37. Gate 36 is located so as to be above a portion of P-well 26 proximate source 30, and in this example also above portion 221 of P-substrate 22, and also extend above a portion of N-well 24 to isolation region 28. In this example, portion 221 of substrate 22 extends to surface 27, but this is not essential, and P-well 26 and N-well 24 may abut, that is, without portion 221 therebetween. Either arrangement is useful. P+ ohmic body contact 34 is provided to P-well 26, which in turn is in ohmic contact with P-substrate 22. Electrode 321 is provided in ohmic electrical contact with drain region 32, electrode 361 is provided in ohmic electrical contact with gate 36 and electrode 301 is provided in ohmic electrical contact with source 30 and body contact 34. Body contact 34 and source 30 are generally shorted together by electrode 301 although this is not essential. When appropriately biased, source-drain current Id 33 flows from source 30 through channel 25 in P-well 26, (and P-substrate 22 if a portion thereof extends to surface 27) into N-well drift region 24 and under dielectric isolation region 28 to drain region 32.

Figure 2:
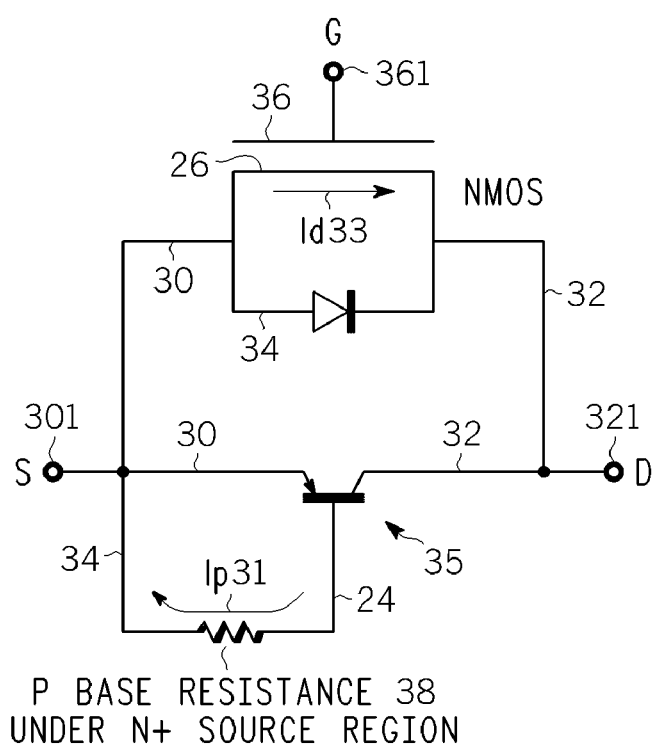
FIG. 2 is a simplified schematic circuit diagram of the device of FIG. 1, illustrating the parasitic bipolar device that can exist in such structure.

FIG. 2 shows a simplified schematic diagram of equivalent circuit 40 of device 20 of FIG. 1, illustrating parasitic bipolar device 35 that exists in such structure. Like reference numbers are used in FIG. 2 corresponding to the analogous regions in device 20 of FIG. 1. Referring again to FIG. 1, when device 20 of FIG. 1 is operating under high-voltage and high-current condition, N-well region 24 can be fully depleted of free carriers and with assistance from current Id 33 flowing through it, avalanche electron-hole pair generation region 39 can exist near drain region 32 adjacent dielectric isolation region 28. This can give rise to generation of minority carriers into N-well 24 from region 39, which in turn provides parasitic current Ip 31 that flows from region 39, passing under source region 30, to P+ body contact region 34. The portion of P-well 26 beneath source 30 through which parasitic current Ip 31 passes has a finite resistance 38, which provides base-emitter bias to parasitic bipolar transistor 35 of FIG. 2. Since Id 33 is an electron current and Ip 31 is a hole current, they add so that the total current It between terminals 301 and 321 is the sum of the magnitude of the two currents, that is, |It|=|Id|+|Ip|. Under certain operating conditions, positive feedback can occur ands the total current It can increase rapidly leading to premature device instability and/or failure. Thus, a consequence of the existence of parasitic transistor 35 is that the properties of device 20 are degraded, especially the safe operating area (SOA) and the ability of the device to resist destructive damage due to transients.

Figure 3:
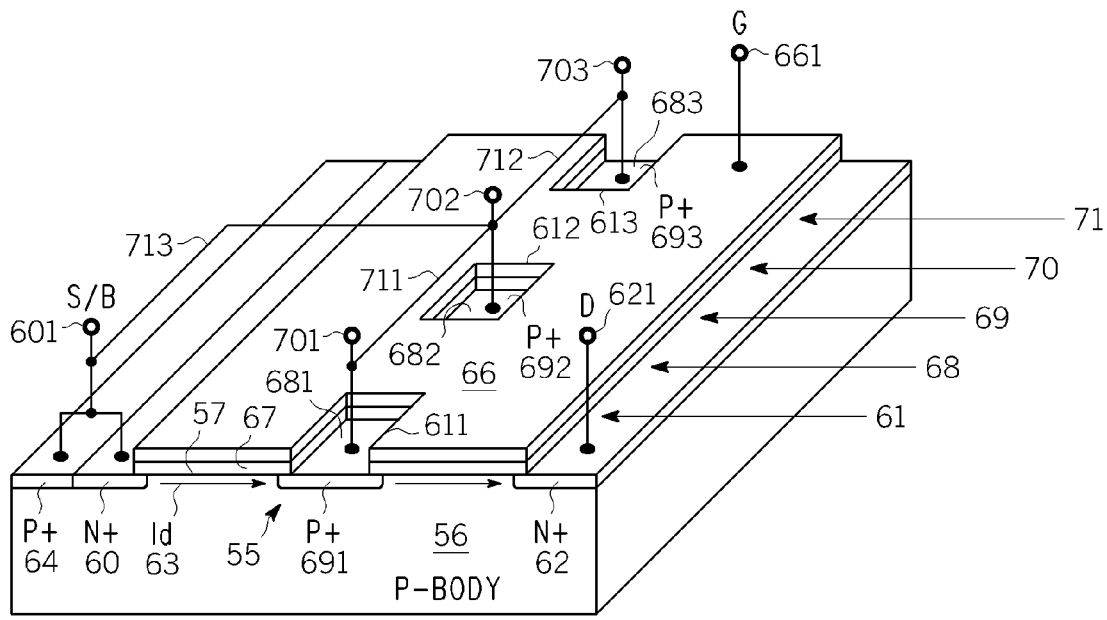
FIG. 3 is a simplified schematic isometric and cross-sectional view through a generalized MOSFET according to an embodiment of the invention.
Figure 4:
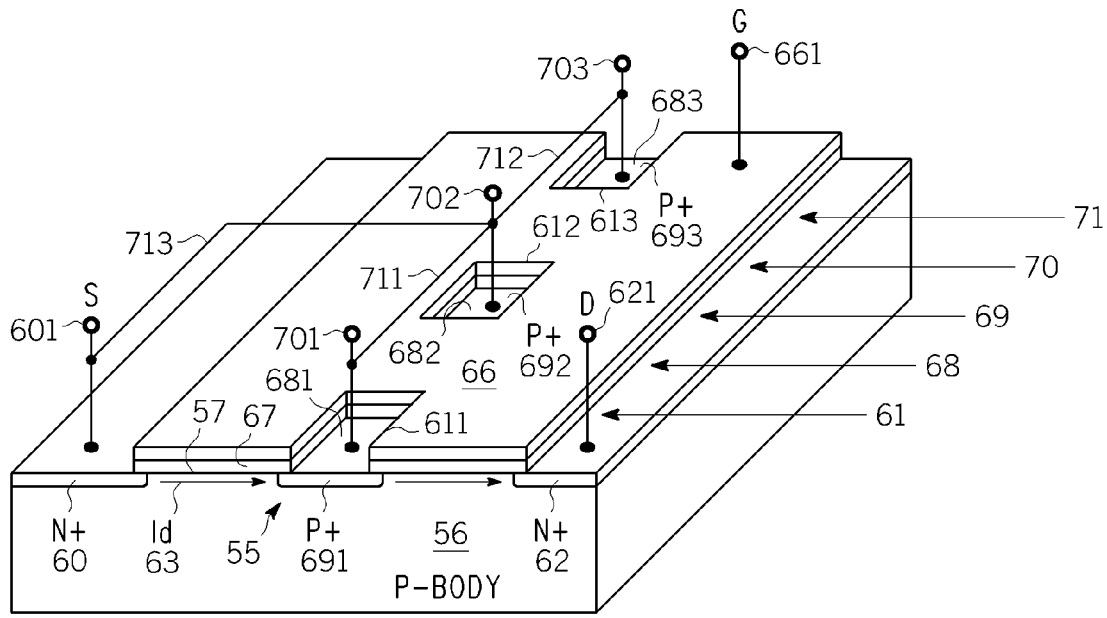
FIG. 4 is a simplified schematic isometric and cross-sectional view through a generalized MOSFET according to a further embodiment of the invention.

It has been discovered that the adverse consequences of the parasitic bipolar device inherently associated with many MOSFETs can be substantially defeated by adopting what is referred to herein as a "dotted channel" structure. FIG. 3 is a simplified schematic isometric and cross-sectional view through generalized MOSFET 50 according to an embodiment of the invention. MOSFET 50 comprises P-body 56 with surface 57. N+ source 60 and N+ drain 62 are formed in P-body 56 at surface 57. Gate dielectric 67 is formed on surface 57 and surmounted by conductive control gate 66. P+ body contact region 64 is desirably provided adjacent to source region 60, but this is not essential. P+ body contact region 64 is in ohmic contact with P-body 56. P-body 56 of device 50 is analogous to P-well 26 and/or portion 221 of P-substrate 22 of device 20 of FIG. 1, or a combination thereof. Gate 66 of device 50 is analogous in function to gate 36 of device 20, that is, to control the flow of source-drain current Id 63 in channel 55 (see also FIG. 5). For simplicity of illustration, regions equivalent to N-well 24 and P-well 26 of device 20 are omitted in FIG. 3, but can also be included. When gate 66, source 60 and drain 62 are appropriately biased, then source-drain current Id 63 flows from source 60 through channel 55 in P-body 56 to drain 62 around P+ islands 691, 692, 693, etc (see also FIG. 5). Device 50 of FIG. 3 differs from device 20 of FIG. 1 in that device 50 has openings 611, 612, 613, etc., (collectively 61) cut through gate 66 to expose regions 681, 682, 683, etc., (collectively surface portion 68) of surface 57 of P-body 56. P+ doped regions 691, 692, etc., (collectively 69) are provided in surface portions 68 underneath openings 61. This is most easily accomplished by ion implantation using gate 66 with openings 61 as a mask, but other doping means and methods may also be used. P+ regions 69 are conveniently formed at the same time as P+ body contact region 64, with about the same carrier concentration and depth into P-body 56, but this is not essential. Electrode 621 is provided in ohmic electrical contact with drain region (D) 62, electrode 661 is provided in ohmic electrical contact with gate (G) 66, and electrode 601 is provided in ohmic electrical contact with N+ source region (S) 60 and P+ body contact region (B) 64. Electrodes 701, 702, 703, etc., (collectively 70) are provided in ohmic contact to P+ regions 69 and desirably electrically coupled to source/body (S/B) electrode 601, for example by leads 711, 712, 713, etc., (collectively 71). Source-drain current Id 63 then flows around P+ regions 69 (see FIG. 5). FIG. 4 is a simplified schematic isometric and cross-sectional view through generalized MOSFET 51 according to a further embodiment of the invention. Device 50 of FIG. 3 and device 51 of FIG. 4 differ only in that, in device 51, P+ body contact 64 is omitted and electrodes 71 are tied back to electrode 602 which makes ohmic contact to N+ source 60. Accordingly, the discussion of the various elements of device 50 is incorporated by reference in the discussion of device 51. The arrangement of device 50 wherein P+ body contact 64 is included is preferred.

Figure 5:
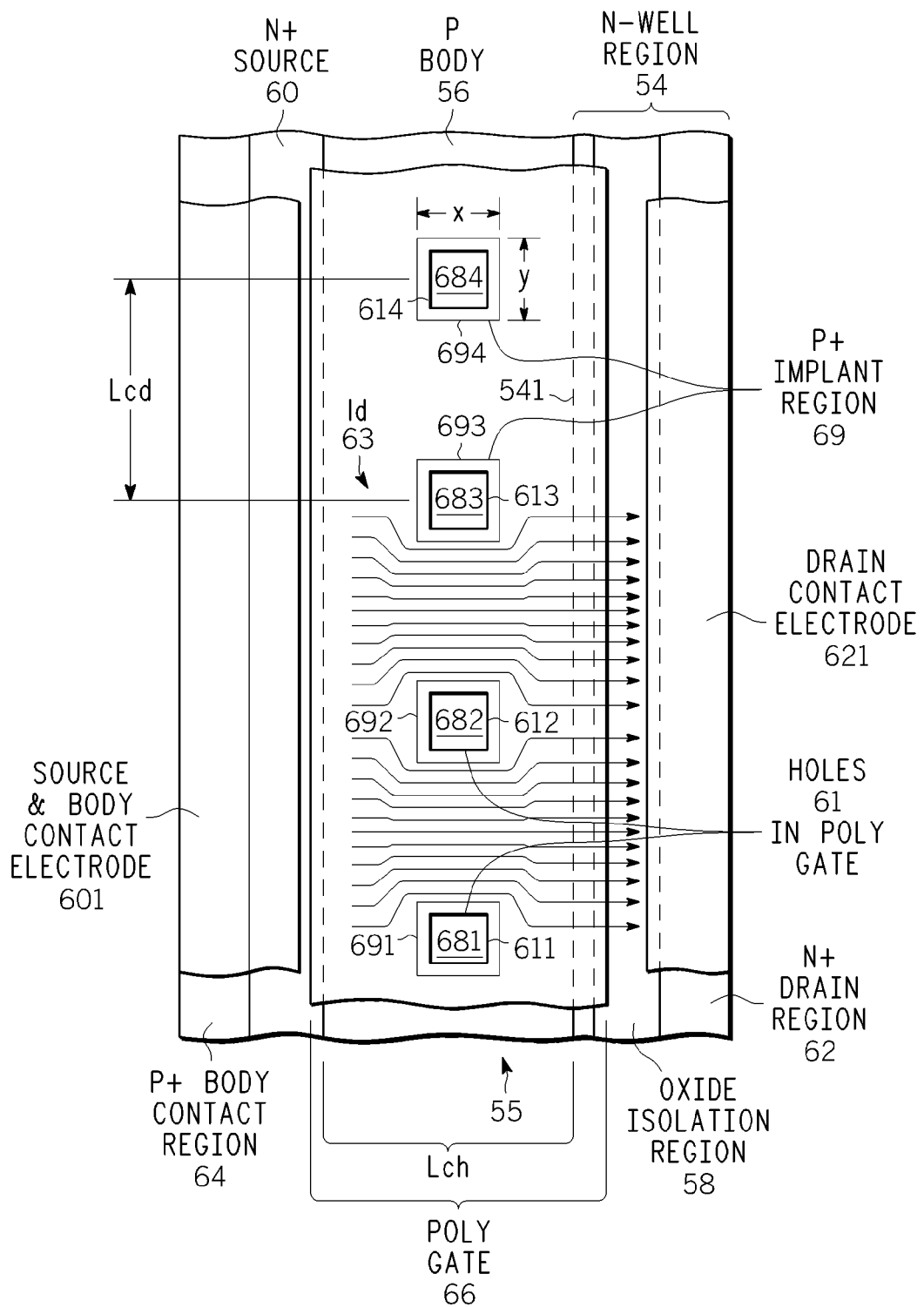
FIG. 5 is a simplified partially cut-away plan view of the device of FIG. 3.
Figure 16:
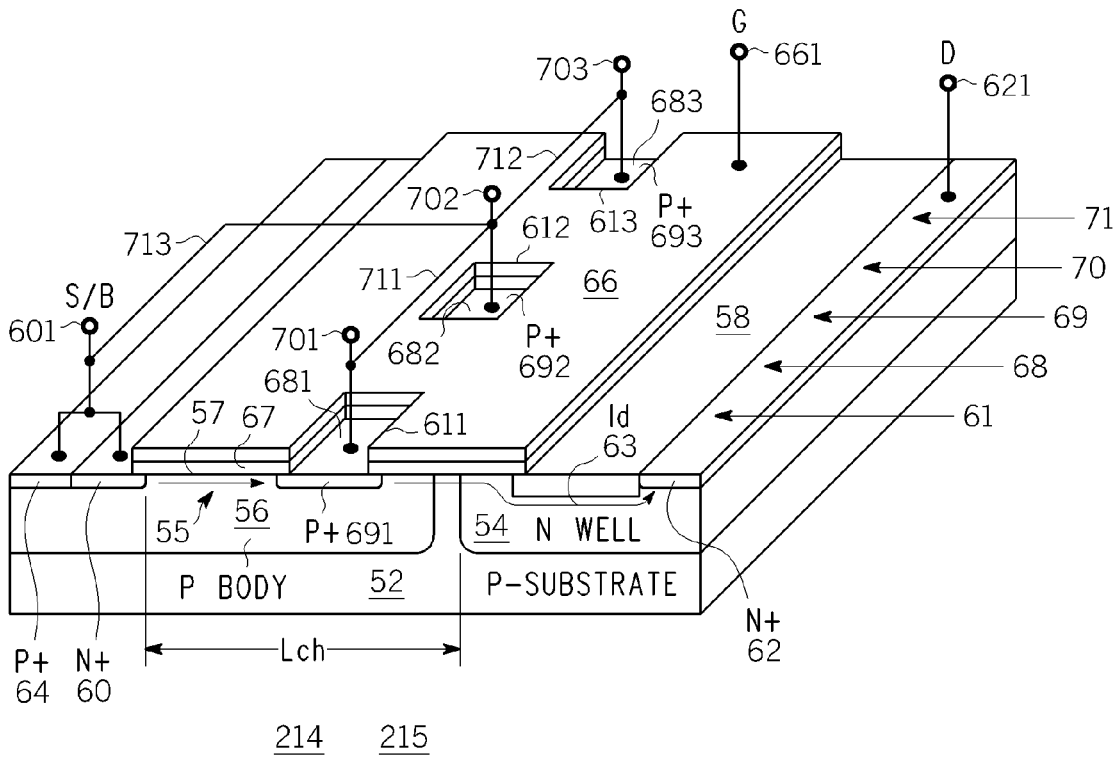

FIG. 5 shows simplified partially cut-away plan view 75 of the devices of FIGS. 3, 4 and 16, adding further details. For simplicity of illustration, it is assumed in FIG. 5 that P body 56 extends to N-well 54, that is, no portion of substrate 52 intervenes, but this is not essential. The channel length Lch is the distance between source 60 and edge 541 of N-well 54 (see also FIG. 16). It will be noted that P+ implant regions 691, 692, 693, etc. (collectively 69), are located in channel region 55 between source 60 and drain 62, spaced apart like a series of dots by distance Lcd along the width of channel region 55 and gate 66 (in FIG. 5, the "width" of channel region 55 and gate 66 are in the vertical direction and the channel "length" is in the horizontal direction). The spacing Lcd of P+ regions or dots 69 is usefully about 0.5 to 20 times channel length Lch, more conveniently about 1 to 10 times channel length Lch, and preferably about 1 to 5 times channel length Lch. While P+ channel dots 69 are shown as being uniformly spaced in FIG. 5 and is preferred, this is not essential and non-uniform spacing may also be used. It is desirable that each P+ region or dot 69 have x and y dimensions that are usefully in the range of about 10 to 50 percent of channel length Lch, more conveniently in the range of about 20 to 40 percent of channel length Lch, and preferably in the range of about 20 to 30 percent of channel length Lch. While doped regions 69 and holes 61 in gate 66, through which doped regions 69 are preferably formed, are shown as being approximately square in plan view, this is not essential and other shapes may also be used. However, a substantially square plan view shape is preferred for holes 61 and doped regions 69. While it is preferred to form P+ doped regions 69 by ion implantation through holes 61 in gate 66, this is not essential and any convenient means of providing P+ doped regions or dots 69 may also be used.

Figure 6:
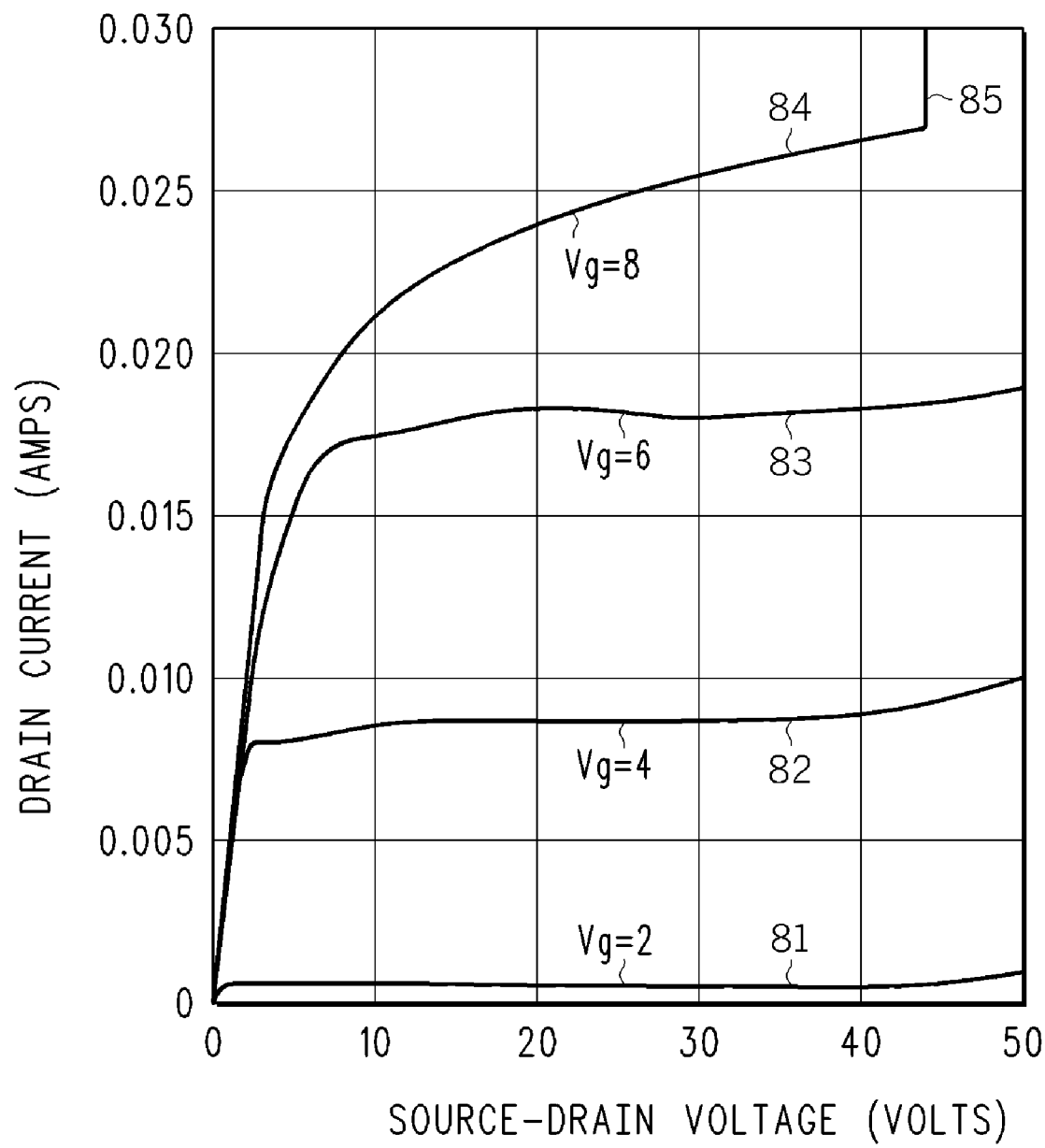
FIG. 6 is a plot of drain current in amps versus source-drain voltage in volts for different gate voltages Vg, for a device such as is illustrated in FIG. 1.

FIG. 6 shows plot 80 of drain current in amps versus source-drain voltage in volts for different gate voltages Vg, for a device such as is illustrated in FIG. 1. Trace 81 shows the data for gate voltage Vg=2 volts, trace 82 for Vg=4 volts, trace 83 for Vg=6 volts and trace 84 for Vg=8 volts. It will be noted in trace 84 that at condition 85 where the source-drain voltage is about forty-four volts, the device becomes unstable and destructive failure can occur if the current is not limited. At this point, the safe operating area (SOA) of the device has been exceeded.

Figure 7:
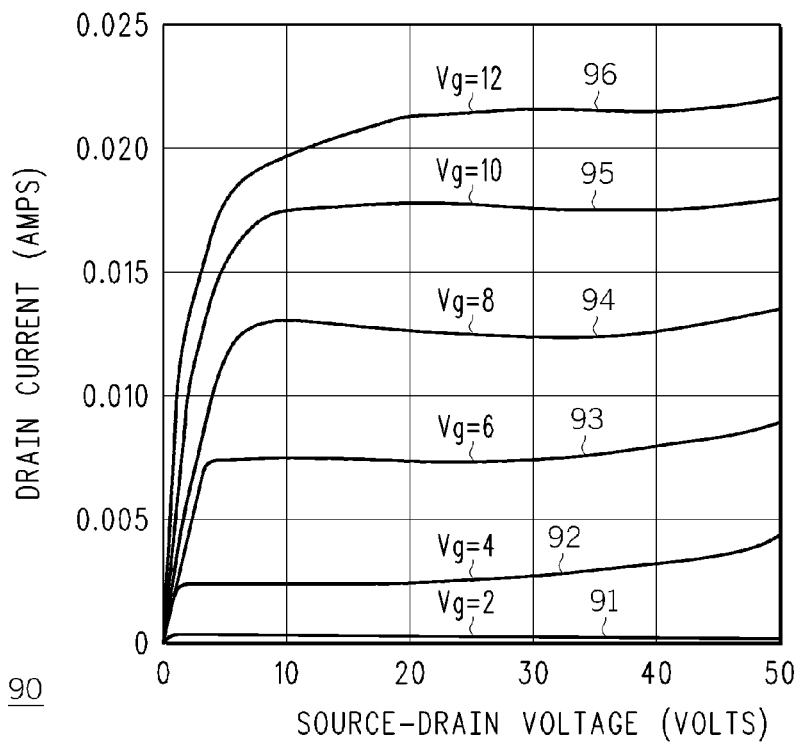
FIG. 7 is a plot of drain current in amps versus source-drain voltage in volts for different gate voltages Vg, for an otherwise similar device to that used in connection with FIG. 6, but including a dotted gate structure according to the embodiment of the invention illustrated in FIG. 3.

FIG. 7 shows plot 90 of drain current in amps versus source-drain voltage in volts for different gate voltages Vg, for an otherwise similar device to the device used in connection with FIG. 6, but including the dotted gate structure according to the embodiment of the invention illustrated, for example, in FIG. 16. Trace 91 shows the data for gate voltage Vg=2 volts, trace 92 for Vg=4 volts, trace 93 for Vg=6 volts, trace 94 for Vg=8 volts, trace 95 for Vg=10 volts, and trace 96 for Vg=12 volts. It will be noted that the instability occurring at condition 85 of FIG. 6, is not observed with this device incorporating the dotted channel structure provided in an embodiment of the invention. Accordingly, the SOA of device 50, 75, 214 is improved compared to prior art device 20. The device tested for FIG. 7 has a slightly greater channel length Lch than the device of FIG. 6, which accounts for the somewhat lower current levels in FIG. 7.

Figure 8:
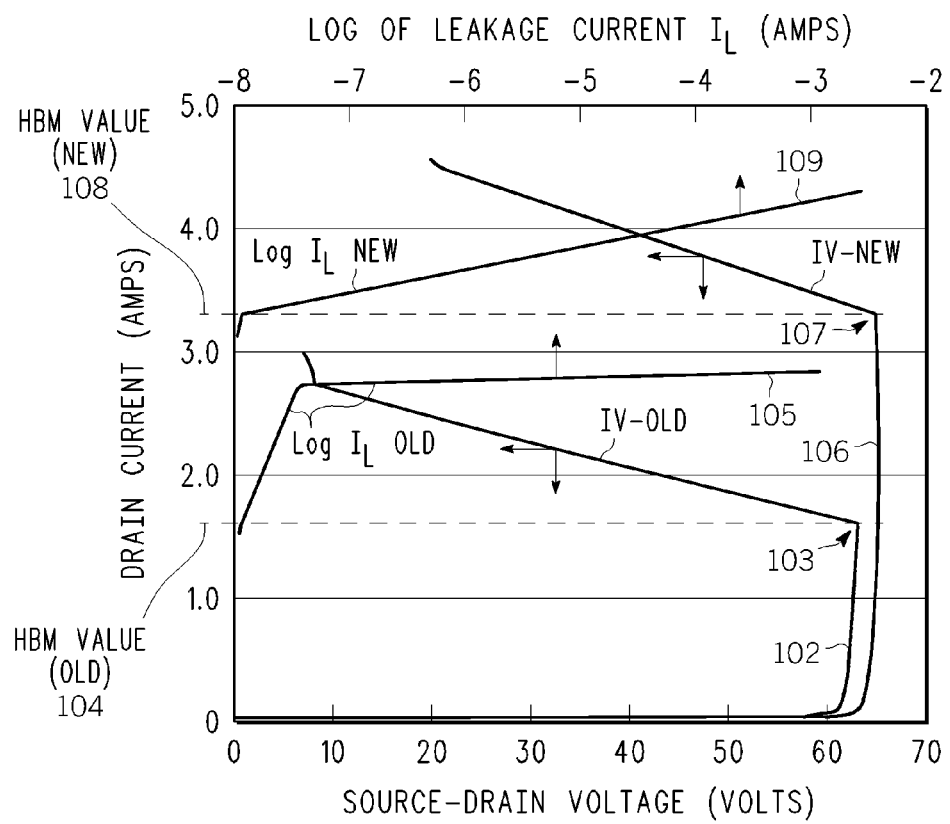
FIG. 8 is a two-part plot: (a) of the current-voltage (IV) characteristics (in amps versus volts), and (b) the log of the leakage current in amps, for the device whose properties are illustrated in FIG. 6 (labeled "OLD") compared to the device whose properties are illustrated in FIG. 7 (labeled "NEW") when stressed to failure, in order to determine the relative Human Body Model (HBM) transient stress tolerance.

FIG. 8 shows two-part plot 100: (a) plots 102, 106 of the current-voltage (I-V) characteristics (in amps versus volts), and (b) plots 105, 109 of the log of the leakage current in amps. Traces 102, 105 are from the device whose properties are illustrated in FIG. 6 (labeled "OLD") and traces 106, 109 are from the device whose properties are illustrated in FIG. 7 (labeled "NEW"). These devices were stressed to failure, in order to determine the relative Human Body Model (HBM) transient stress tolerance. The HBM stress tolerance is a well known measure giving an estimate of the ability of a device to withstand, for example, a static electricity discharge generated by a human touching the device under conditions where the human has accumulated a static charge, as for example, by walking across a carpet formed from a non-conductive synthetic yarn or fiber material. The HBM value is obtained by multiplying the current at which the device I-V characteristics sharply depart from normal operation by a predetermined impedance, e.g., 1500 Ohms. Such departure from normal operation is observed in FIG. 8 at corner 103 of trace 102 and corner 107 of trace 106, wherein the voltage drops with further increase in current, and when the log of the device leakage current begins to change by order of magnitude as shown by traces 105, 109. HBM value 104 for prior device 20 is about 1.6 (amps)×1500 (Ohms)=2.4 kilo-Volts. HBM value 108 for invented device embodiment 60, 75, 214 is about 3.4 (amps)×1500 (Ohms)=5.1 kilo-Volts, over twice that observed for prior art device 20. In addition to the improved SOA, breakdown voltage of the invented device is at least 10% greater than the prior art device and, as noted above, the HBM values are over 100% improved. These are significant advantages.

FIGS. 9-16 illustrate schematically, in isometric cross-sectional view, manufacturing stages, evenly numbered from 200 to 214 according to still further embodiments of the invention for fabricating MOSFETS of the type generally illustrated in FIGS. 3, 4 and 5, and providing additional detail. For brevity, many conventional steps will only be mentioned briefly herein or will be omitted entirely without providing the well known process details. Structures, oddly numbered from 201 to 215, result from evenly numbered manufacturing stages 200-214, respectively. The discussion of the various regions that make up devices 50, 51 and 75 in FIGS. 3-5 and the relative doping types and doping concentration of such regions are included herein by reference and FIGS. 9-16 should be considered in conjunction with FIGS. 3-5. As noted earlier, the manufacturing stages of FIGS. 9-16 are, for convenience of explanation and not intended to be limiting, described for an N-channel device, but persons of skill in the art will understand that, for example, by substituting doping of opposite conductivity type for the various regions, P-channel and other types of devices may also be fabricated. Also, mask layers associated with the various manufacturing stages are omitted. Rather, the results of the masking operations are shown and described rather than the masks themselves. Persons of skill in the art will understand based on the description herein how to provide appropriate masks to achieve the doped, etched and/or patterned regions described herein.

Figure 9:
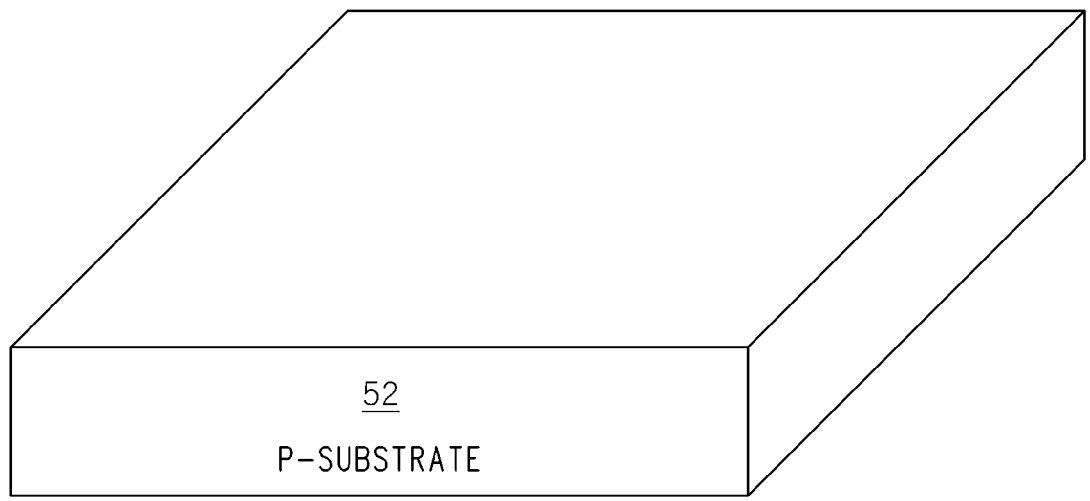
FIGS. 9-16 illustrate schematically, in isometric and cross-sectional view, method stages accordance with still further embodiments of the invention for fabricating MOSFETS of the type generally illustrated in FIG. 3.

Referring now to manufacturing stage 200 of FIG. 9, supporting P-type substrate 52 is provided. Substrate 52 may be a semiconductor of, for example and not intended to be limiting, silicon or other type IV or III-V or II-VI or organic semiconductor or combinations thereof, and may be in the form of a single crystal or polycrystalline or of a layer that has been formed on another substrate. Silicon-on-insulator (SOI) is a non-limiting example of such an alternative structure.

Substrate 52 is doped to a concentration desirably in the range of about 5E14 to 5E17 cm$^{-3}$, more conveniently in the range of about 1E15 to 1E16 cm$^{-3}$, and preferably in the range of about 2E15 to 5E15 cm$^{-3}$. Persons of skill in the art will also understand that various buried layers and isolation walls (not shown) may be provided in connection with substrate 52. These are omitted here to avoid cluttering the figures and obscuring the invention. Structure 201 corresponds to manufacturing stage 200.

Figure 10:
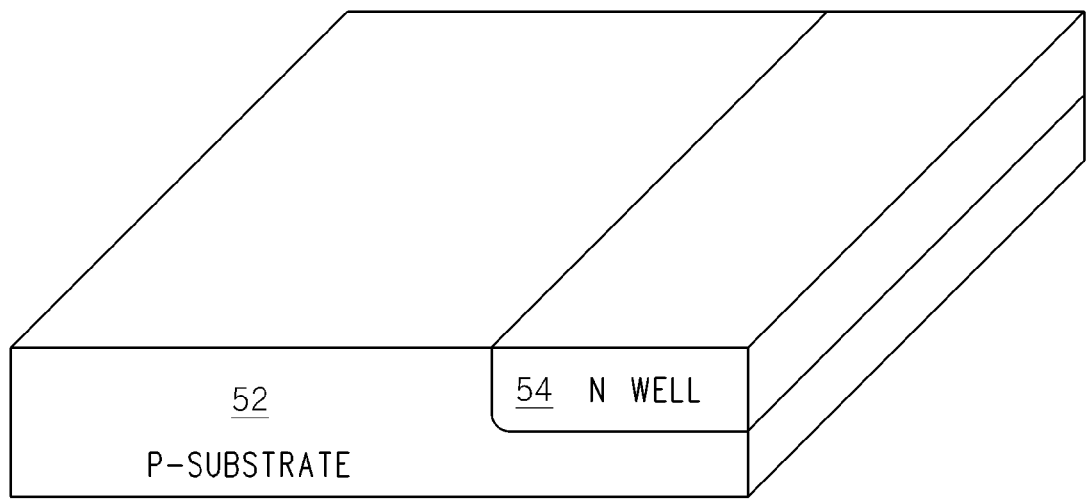

In manufacturing stage 202 of FIG. 10, substrate 52 of stage 200 is masked and patterned to provide a mask opening (not shown) corresponding to the location of N-well 54. N-well 54 is formed by introducing N-type dopant through the opening in this mask. Ion implantation and annealing is the preferred doping method for forming N-well 54. N-well 54 is doped to a concentration desirably in the range of about 1E15 to 1E17 cm$^{-3}$, more conveniently in the range of about 1E15 to 1E16 cm$^{-3}$, and preferably in the range of about 1E15 to 2E15 cm$^{-3}$ N-well region 54 is typically about 0.5 to 2.0 micro-meters deep, but shallower or deeper regions can also be used. Structure 203 results.

Figure 11:
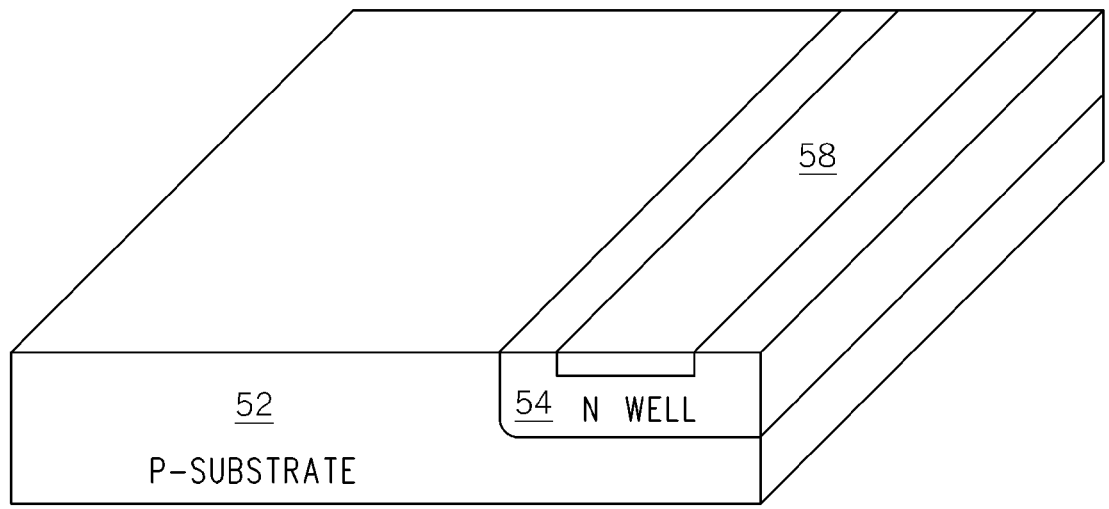

Referring now to manufacturing stage 204 of FIG. 11, shallow trench dielectric isolation region 58 is formed by, for example, providing an oxidation resistant mask having the size an alignment indicated for locating isolation region 58 within N-well 54. Silicon nitride is an example of a suitable oxidation resistant mask. Dielectric isolation region 58 can be formed by local oxidation of the portion of substrate 52 exposed through the oxidation mask or by etch and refill using deposited oxide or other dielectric with or without a planarization step. Such procedures are well known in the art. Dielectric isolation region 58 is typically about 0.1 to 1.0 micrometers deep. Shallower or deeper regions may also be used, but in any case less than the depth of N-well 54. Structure 205 results.

Figure 12:
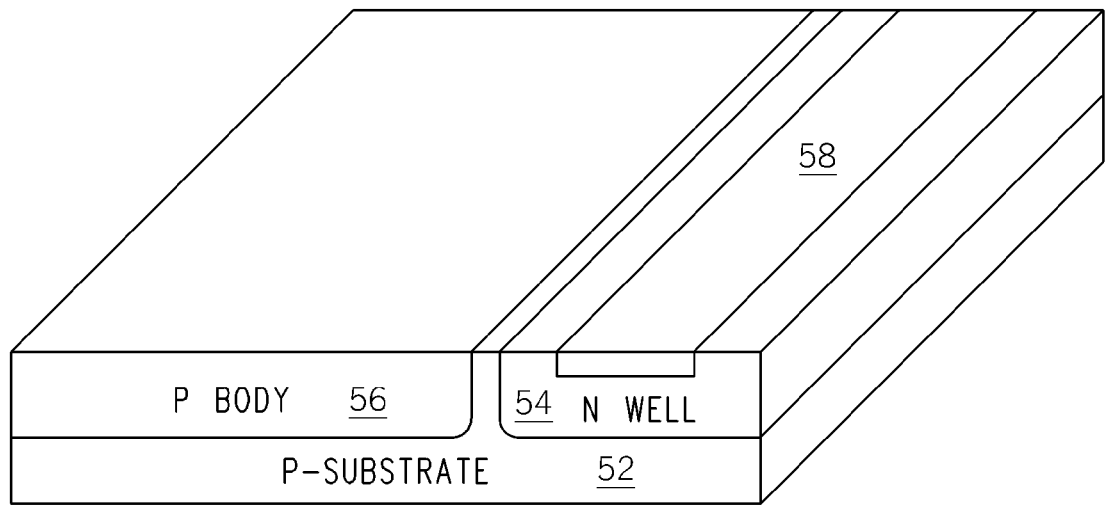

In manufacturing stage 206 of FIG. 12, a mask (not shown) is provided with an opening located to the left of N-well 54 whereby P-body region 56 is formed by, for example, ion implant doping and annealing of the exposed portion of substrate 52 or by other convenient doping means. P-body region 56 is doped to a concentration desirably in the range of about 1E16 to 1E18 cm$^{-3}$, more conveniently in the range of about 5E16 to 1E18 cm$^{-3}$, and preferably in the range of about 1E17 to 5E17 cm$^{-3}$. P-body region 56 is typically in the range of about 0.5 to 2.0 micrometers deep, but shallower or deeper regions may also be used. Structure 207 results.

Figure 13:
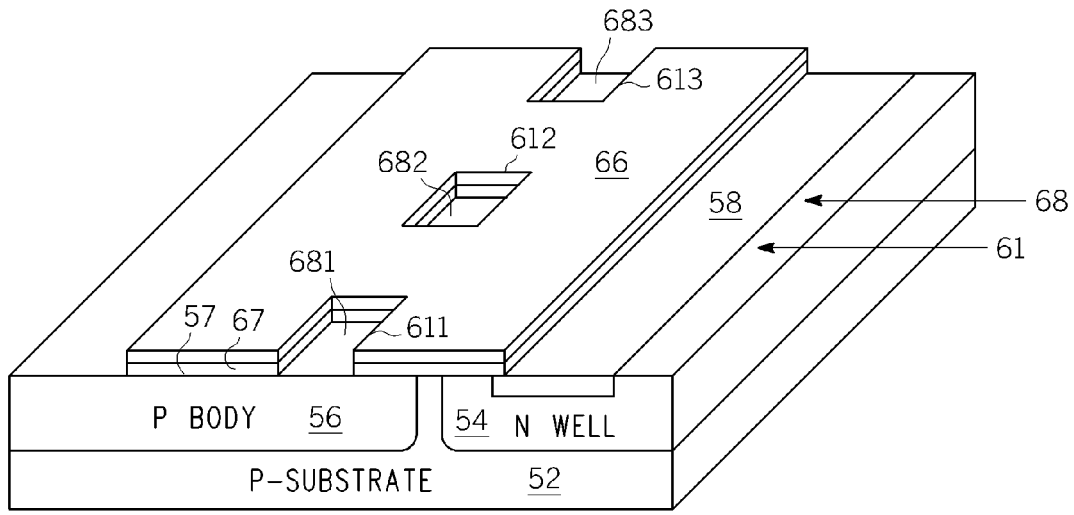

In manufacturing stage 208 of FIG. 13, surface 57 of substrate 52 is provided, at least locally where the channel region is desired to be, with thin gate dielectric 67 (e.g., of silicon oxide) surmounted by conductive gate 66 (e.g., of doped polysilicon). Gate dielectric 67 is typically about 0.01 to 0.2 micrometers thick with about 0.01 to 0.05 micrometers being preferred, but thinner or thicker layers may also be used. Gate 66 is typically about 0.05 to 0.5 micrometers thick with about 0.15 to 0.25 being preferred, but thinner or thicker layers may also be used. While polysilicon is a useful material for gate 66, other conductive materials, such as for example; and not intended to be limiting, metals, metal alloys, semi-metals, conductive silicides and nitrides, and mixtures thereof may also be used according to the needs of the device designer. These layers are usually provided in the form of substantially continuous layers that are then masked using, for example, hard or soft masks (not shown), and etched to define the lateral extent of gate 66. Underlying gate dielectric 67 may be patterned or not according to further process steps intended to be used. At the same time as gate 66 is laterally delineated, holes 611, 612, 613, etc., (collectively 61) are etched open to expose regions or locations 681, 682, 683, etc., (collectively 68) underlying gate 66, in the locations described in connection with FIGS. 3-5. Holes 61 may extend only to dielectric layer 67 or through dielectric layer 67 to surface 57 of substrate 52, as shown in FIGS. 13-16. Either arrangement is useful, but leaving dielectric (e.g., oxide) 67 in-place in openings 61 is preferred. Structure 209 results.

Figure 14:
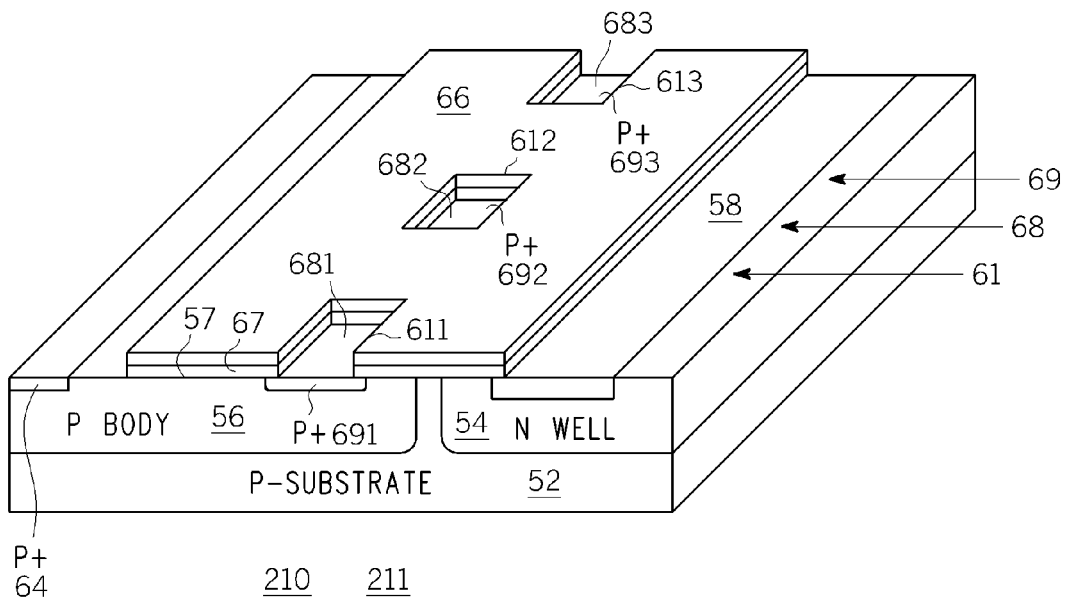

In manufacturing stage 210 of FIG. 14, P+ regions 691, 692, 693, etc., (collectively 69) are formed through openings 61 in gate 66 in locations 681, 682, 683, etc. P+ body contact region 64 is desirably also formed at the same time, e.g., during the same implant and anneal step, using a mask (not shown) to limit the extent of region 64 as indicated in FIG. 14. P+ body contact region 64 and P+ regions 69 are doped to a concentration desirably in the range of about 1E18 to 1E21 cm$^{-1}$, more conveniently in the range of about 5E18 to 5E20 cm$^{-1}$, and preferably in the range of about 1E19 to 1E20 cm$^{-3}$. Regions 64 and 69 are typically in the range of about 0.05 to 0.3 micrometers deep, but shallower or deeper regions may also be used and region 64 may have a different doping concentration and/or depth than regions 69. Structure 211 results.

Figure 15:
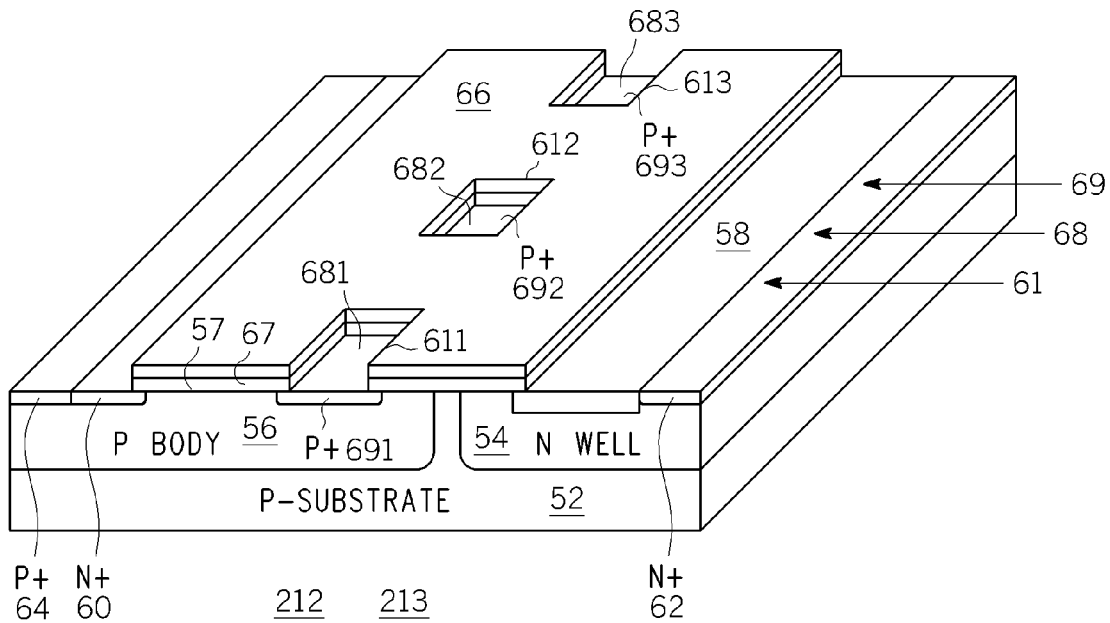

In manufacturing stage 212 of FIG. 15, N+ source region 60 and N+ drain region 62 are desirable formed, preferably by ion implantation and annealing, although any convenient doping method may be employed. In doing so, those regions where such N+ implants are not desired are masked (not shown) using means well known in the art. N+ regions 60, 62 are doped to a concentration desirably in the range of about 1E18 to 1E21 cm$^{-3}$, more conveniently in the range of about 5E18 to 5E20 cm$^{-3}$, and preferably in the range of about 1E19 to 1E20 cm$^{-3}$. Regions 60 and 62 are typically in the range of about 0.05 to 0.3 micrometers deep, but shallower or deeper regions may also be used and region 60 may have a different doping concentration and/or depth than region 62. In the preferred arrangement, regions 60 and 62 have the same doping concentration and depth. Structure 213 results. Manufacturing stages 210 and 212 may be performed in either order.

In manufacturing stage 214 of FIG. 16, conductive terminals and/or interconnections 70 and 71 are provided along with drain electrode 621, source/body electrode 601 and gate electrode 661. A wide variety of conductive materials may be used suitable for making ohmic connections to the various semiconductor regions, 60, 62, 64 and 69. Interconnections 71 (e.g., 711, 712, 713, etc.) are provided to tie electrodes 70 (e.g., 701, 702, 703, etc.) contacting P+ regions 69 to source/body electrode 601. When a device of the general type illustrated in FIG. 4 is desired, then region 64 formed in manufacturing stage 210 is omitted and electrodes 70 and interconnections 71 can be tied to electrode 602 (see FIG. 4) coupled to source region 60 alone. Alternatively, a body contact may be provided elsewhere than adjacent to source contact region 60 and P+ region 69 coupled thereto. Either arrangement is useful. Structure 215 results. It will be noted that the manufacturing sequence illustrated in FIGS. 9-16 provides those additional N and P wells shown in FIG. 1, thereby illustrating how such regions may be incorporated in devices of the type illustrated generally in FIGS. 3-5. A device of the type illustrate in FIG. 16 was used in obtaining the electrical data shown in FIGS. 7 and 8 (NEW).

According to a first embodiment, there is provided a field effect device, comprising, a semiconductor body having a surface, a source located in the semiconductor body proximate the surface, a drain located in the semiconductor body proximate the surface and spaced apart from the source, an insulated control gate located over the semiconductor body between the source and drain and adapted to control a conductive channel extending between the source and drain, multiple highly doped regions of the same conductivity type as the semiconductor body located in the channel between the source and drain, and one or more electrical connections coupling at least some of the multiple highly doped regions to the semiconductor body. In a further embodiment, the multiple highly doped regions are substantially square. In a still further embodiment, the multiple highly doped regions are formed by doping the semiconductor body through corresponding holes in the control gate. In a yet further embodiment, the device has a predetermined channel length Lch and channel width and the multiple highly doped regions are spaced apart along the width by a distance in the range of 0.5 to 20 times the channel length Lch. In a still yet further embodiment, the multiple highly doped regions are spaced apart by a distance in the range of 1 to 10 times the channel length Lch. In a yet still further embodiment, the multiple highly doped regions are spaced apart by a distance in the range of 1 to 5 times the channel length Lch. In an additional embodiment, the device has a predetermined channel length Lch and the multiple highly doped regions have lateral dimensions of about 10 to 50 percent of the channel length Lch. In a still additional embodiment, the lateral dimensions are about 20 to 40 percent of the channel length Lch. In a yet additional embodiment, the lateral dimensions are about 20 to 30 percent of the channel length Lch.

According to a second embodiment, there is provided a method for forming a dotted channel field effect device, comprising, providing a semiconductor substrate of a first conductivity type and having a surface, forming a well region of a second, opposite, conductivity type in a first part of the substrate extending to the surface, forming a body region of the first conductivity type in a second part of the substrate extending to the surface and in contact with or spaced apart from the well region, forming a control gate insulated from the surface over at least a portion of the body region and having therein multiple holes extending through the control gate and located over the portion of the body region, forming multiple highly doped regions of the first conductivity type in the body region through the multiple holes, forming source and drain regions of the second, opposite, conductivity type in the substrate on either side of the control gate, and providing electrical terminals to the source, drain, control gate and the multiple highly doped regions. In a further embodiment, the control gate is adapted to form a channel of length Lch extending from the source toward the drain and a width W substantially parallel to the source and drain, and wherein the multiple holes are spaced apart a predetermined distance along the width W in the range of 0.50 to 20 times Lch. In a still further embodiment, the predetermined distance is in the range of 1 to 10 times Lch. In a yet further embodiment, the predetermined distance is in the range of 1 to 5 times Lch. In a still yet further embodiment, the control gate is adapted to form a channel of length Lch extending from the source toward the drain and a width W substantially parallel to the source and drain, and wherein the multiple holes have lateral dimensions in the range of about 10 to 50 percent of Lch. In a yet still further embodiment, the lateral dimensions are in the range of about 20 to 40 percent of Lch. In an additional embodiment, the lateral dimensions are in the range of about 20 to 30 percent of Lch.

According to a third embodiment, there is provided a dotted-channel MOSFET, comprising, a semiconductor body having a surface and of a first conductivity type, a source of a second, opposite, conductivity type located in the semiconductor body proximate the surface, a drain of the second, opposite, conductivity type located in the semiconductor body proximate the surface and spaced apart from the source, an insulated control gate located over the semiconductor body between the source and drain and adapted to control a conductive channel extending from the source toward the drain, and multiple highly doped spaced-apart regions of the same conductivity type as the semiconductor body located in the channel between the source and drain. In an additional embodiment, the MOSFET further comprises, one or more electrical connections coupling some or all of the multiple highly doped spaced-apart regions to the source or the semiconductor body. In a still additional embodiment, the MOSFET further comprises a drift region of the second, opposite, conductivity type, proximate the drain and extending toward but not to the source, and wherein the multiple highly doped spaced-apart regions are located between the source and the drift region. In a yet additional embodiment, the drift region is spaced a predetermined distance from the source at the surface, and the multiple highly doped spaced-apart regions are separated by 0.5 to 20 times said distance.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a dotted channel field effect device, comprising:
    providing a semiconductor substrate of a first conductivity type and having a surface;
    forming a well region of a second, opposite, conductivity type in a first part of the substrate extending to the surface;
    forming a body region of the first conductivity type in a second part of the substrate extending to the surface and in contact with or spaced apart from the well region;
    forming a control gate insulated from the surface over at least a portion of the body region and having therein multiple holes extending through the control gate and located over the portion of the body region;
    forming multiple highly doped regions of the first conductivity type in the body region through the multiple holes;
    forming source and drain regions of the second, opposite, conductivity type in the substrate on either side of the control gate; and
    providing electrical terminals to the source, drain, control gate and the multiple highly doped regions.

2. The method of claim 1, wherein the control gate is adapted to form a channel of length Lch extending from the source toward the drain and a width W substantially parallel to the source and drain, and wherein the multiple holes are spaced apart a predetermined distance along the width W in the range of 0.50 to 20 times Lch.

3. The method of claim 2, wherein the predetermined distance is in the range of 1 to 10 times Lch.

4. The method of claim 3, wherein the predetermined distance is in the range of 1 to 5 times Lch.

5. The method of claim 1, wherein the control gate is adapted to form a channel of length Lch extending from the source toward the drain and a width W substantially parallel to the source and drain, and wherein the multiple holes have lateral dimensions in the range of about 10 to 50 percent of Lch.

6. The method of claim 5, wherein the lateral dimensions are in the range of about 20 to 40 percent of Lch.

7. The method of claim 6, wherein the lateral dimensions are in the range of about 20 to 30 percent of Lch.

* * * * *